(12) United States Patent
Coss, Jr. et al.

(10) Patent No.: US 6,871,112 B1
(45) Date of Patent: Mar. 22, 2005

(54) METHOD FOR REQUESTING TRACE DATA REPORTS FROM FDC SEMICONDUCTOR FABRICATION PROCESSES

(75) Inventors: Elfido Coss, Jr., Austin, TX (US); Michael R. Conboy, Austin, TX (US); Bryce A. Hendrix, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/479,852

(22) Filed: Jan. 7, 2000

(51) Int. Cl.[7] .............................................. G06F 19/00
(52) U.S. Cl. ...................... 700/121; 700/96; 700/108; 702/182
(58) Field of Search .................. 700/108–110, 121, 700/96; 702/81–84, 182, 183, 185, 188; 716/4, 19, 21

(56) References Cited

U.S. PATENT DOCUMENTS

| | | | | |
|---|---|---|---|---|
| 4,213,175 A | | 7/1980 | Kurihara ...................... 700/79 |
| 4,861,419 A | * | 8/1989 | Flinchbaugh et al. ......... 216/59 |
| 5,121,335 A | * | 6/1992 | Barouch et al. .............. 716/19 |
| 5,196,997 A | * | 3/1993 | Kurtzberg et al. ............ 702/84 |
| 5,341,304 A | * | 8/1994 | Sakamoto et al. .......... 700/110 |
| 5,442,777 A | | 8/1995 | Nakajima et al. ............. 714/20 |
| 5,576,629 A | * | 11/1996 | Turner et al. ................ 324/709 |
| 5,625,816 A | | 4/1997 | Burdick et al. ......... 707/103 R |
| 5,751,581 A | | 5/1998 | Tau et al. .................... 700/115 |
| 5,859,964 A | * | 1/1999 | Wang et al. .................. 714/48 |
| 6,002,989 A | * | 12/1999 | Shiba et al. .................... 702/84 |
| 6,385,497 B1 | * | 5/2002 | Ogushi et al. .............. 700/110 |
| 6,438,441 B1 | * | 8/2002 | Jang et al. .................. 700/121 |
| 6,465,263 B1 | * | 10/2002 | Coss et al. ..................... 438/14 |
| 6,577,323 B1 | * | 6/2003 | Jamieson et al. ........... 345/700 |
| 6,697,691 B1 | * | 2/2004 | Miller et al. ................ 700/108 |

FOREIGN PATENT DOCUMENTS

| | | |
|---|---|---|
| EP | 0 932 195 | 7/1999 |
| JP | 62048850 | 3/1987 |
| JP | 03022064 | 1/1991 |
| JP | 11119992 | 4/1999 |

OTHER PUBLICATIONS

International Application No. PCT/US00/25736, *PCT International Search Report* (Apr. 19, 2001).

* cited by examiner

*Primary Examiner*—Paul Rodriguez
(74) *Attorney, Agent, or Firm*—Williams, Morgan & Amerson, P.C.

(57) ABSTRACT

The invention is, in its various aspects, a method and apparatus for dynamically generating trace data reports in a semiconductor fabrication process employing fault detection control. The method comprises specifying data including at least one of a parameter, a trigger, and a frequency, for a trace data report; automatically generating from a fault detection controller a request including the specified data to a report generator; formulating the trace data report responsive to the request; and returning the formulated trace data report from the report generator based on the request. The apparatus is a semiconductor fabrication processing system, comprising: a fabrication tool capable of providing at least one of specified data and a trace data report; a fault detection controller capable of automatically generating a request for the trace data report, the request including the specified data; a report generator capable of requesting at least one of the specified data and the trace data report from the fabrication tool and capable of, if the specified data is requested from the fabrication tool, providing the trace data report; and an operator interface for receiving data specified for the trace data report, the specified data including at least one of a parameter, a trigger, and a frequency for the trace data report, and to which the trace data report may be returned from at least one of the report generator and the fabrication tool.

36 Claims, 4 Drawing Sheets

METHOD FOR REQUESTING TRACE DATA REPORTS FROM FDC SEMICONDUCTOR FABRICATION PROCESSES

BACKGROUND OF THE INVENTION

1. Field of the Invention

The present invention relates to fabricating semiconductor devices and, more particularly, to a method for generating trace data reports in a fault detection system.

2. Description of the Related Art

Semiconductor devices, or microchips, are manufactured from wafers of a substrate material. Layers of materials are added, removed, and/or treated during fabrication to create the integrated, electrical circuits that make up the device. The fabrication essentially comprises four operations known as layering, patterning, doping, and heat treatment that can combined in hundreds of different ways, depending upon the particular fabrication process. See, e.g., Peter Van Zant, *Microchip Fabrication A Practical Guide to Semiconductor Processing* (3d Ed. 1997 McGraw-Hill Companies, Inc.) (ISBN 0-07-067250-4). The fabrication process generally involves processing a number of wafers through a series of fabrication tools. Each fabrication tool performs one or more of the four basic operations. The four basic operations are performed in accordance with an overall process to finally produce wafers from which the semiconductor devices are obtained.

One important aspect of the manufacturing process is process control. In particular, the fabrication tools and the fabrication environment must be controlled to achieve a satisfactory process. Certain operational parameters may be monitored and, when desired, the tool's operation can be altered to improve the process to yield more or better wafers.

Competitiveness in the semiconductor manufacturing industry is driven by increasingly complex product and process technologies and global competitive pressures on manufacturers to improve cycle time, quality, and process flexibility. Requirements for sub-quarter-micron device manufacturing and advanced batch control technologies are increasingly important. As wafer sizes increase and feature sizes shrink, equipment and facilities costs rise significantly. Advanced factory-level process control is now recognized as a vital technology for achieving the device yield and productivity levels required to compete effectively, but its deployment has been limited to date by the lack of sufficient integration technology and standards.

Important characteristics in factory-level process controls should include:

scalability—can be applied to a single process tool and its dedicated metrology or across multiple interdependent process areas; the system can be installed on a single computer, or spread across a distributed platform of multiple machines, depending on the performance and reliability requirements;

compatibility with existing systems—designed and validated to work with today's manufacturing systems;

flexibility—control functions are not "hard-wired" into the architecture, but rather embodied in software and control application "plug-ins"; and standards-based for easy portability.

Still other factors may become important, and perhaps even predominate, depending on the context of a particular implementation.

The failure of current process controls to adopt these characteristics produces numerous inefficiencies. Traditional process control has been what is known as statistical process control ("SPC"). SPC usually detects only two types of process problems. An abrupt change in process behavior or incoming material will be flagged when one or two SPC data points fall near or outside the SPC control limits. A shift in a process will be detected by SPC rules that look for four out of five points more than one sigma away from the process mean, or eight consecutive points all on one side of the process mean. SPC systems typically provide for corrective actions to be defined for each of their rules. Abrupt changes will elicit an indication that there is a problem, prompting for manual identification and resolution.

The present invention is directed to resolving one or all of the problems mentioned above.

SUMMARY OF THE INVENTION

The invention is, in its various aspects, a method and apparatus for dynamically generating trace data reports in a semiconductor fabrication process employing fault detection control.

The method comprises specifying data for a trace data report, the specified data including at least one of a parameter, a trigger, and a frequency for the trace data report; automatically generating from a fault detection controller a request to a report generator for the trace data report, the request including the specified data; formulating the trace data report responsive to the request; and returning the formulated trace data report from the report generator based on the request.

In other aspects, the invention comprises a computer programmed to perform this method and a computer-readable, program storage medium encoded with instructions that perform this method when executed by a computer.

The apparatus is a semiconductor fabrication processing system, comprising: a fabrication tool capable of providing at least one of specified data and a trace data report; a fault detection controller implementing a fault detection control, the fault detection controller being capable of automatically generating a request for the trace data report, the request including the specified data; a report generator capable of requesting at least one of the specified data and the trace data report from the fabrication tool and capable of, if the specified data is requested from the fabrication tool, providing the trace data report; and an operator interface for receiving data specified for the trace data report, the specified data including at least one of a parameter, a trigger, and a frequency for the trace data report, and to which the trace data report may be returned from at least one of the report generator and the fabrication tool.

BRIEF DESCRIPTION OF THE DRAWINGS

The invention may be understood by reference to the following description taken in conjunction with the accompanying drawings, in which like reference numerals identify like elements, and in which.

Figure 1:
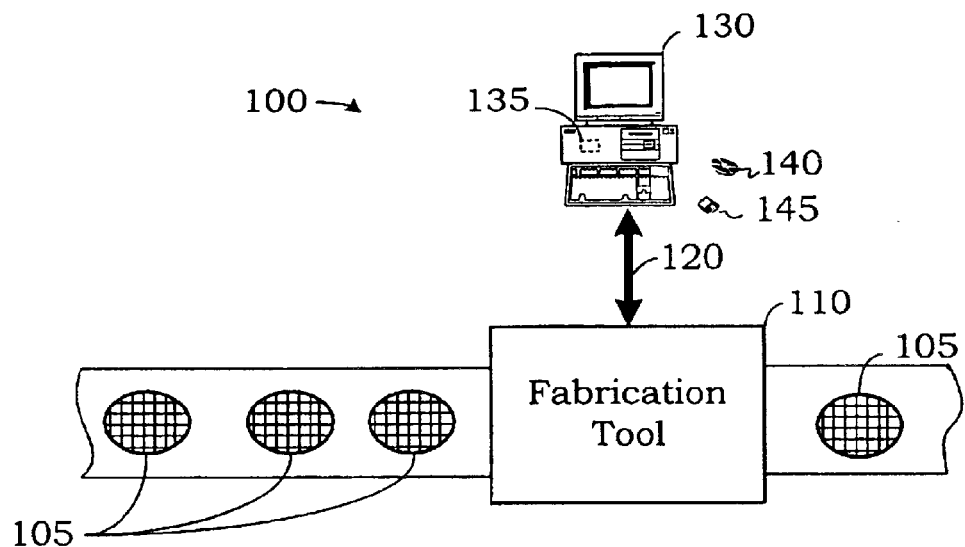
FIGS. 1–2 are conceptual, block diagrams of a particular apparatus in one embodiment of the invention illustrating several aspects thereof.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 2:
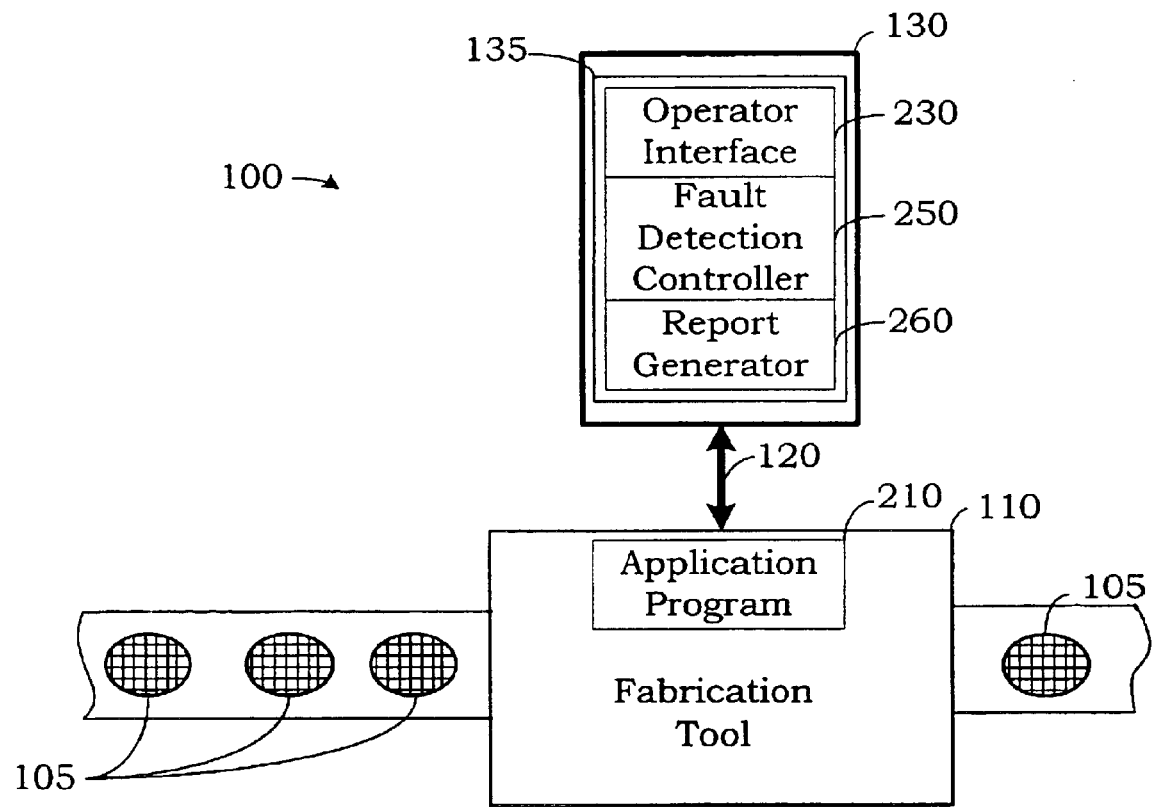

Referring now to FIGS. 1 and 2, an apparatus 100 implementing the present invention in one particular embodiment is illustrated in conceptualized, block diagrams. A lot of wafers 105 is shown being processed through a fabrication tool 110. Four wafers 105 are shown, but the lot of wafers 105, ie., the "wafer lot," may be any practicable number of wafers from one to several thousand. The fabrication tool 110 operates in accordance with an application program 210 resident thereon and may be virtually any kind of fabrication tool known to the art. In various alternative embodiments, for example, the fabrication tool 110 may be an exposure tool or a rapid thermal processing ("RTP") tool. Other embodiments may employ still other types of fabrication tools, and the invention is not limited by the type of the fabrication tool 110.

The fabrication tool 110 communicates data and commands over a line 120 with a controller 130. The line 120 may operate according to any suitable bus protocol known to the art. The controller 130, in the embodiment shown in FIG. 1, is a desktop personal computer. However, this is not necessary to the practice of the invention. Alternative embodiments might implement the controller 130 in a workstation, a notebook computer, or even a mainframe computer, for instance. Some embodiments might even embed the controller 130 in the fabrication tool 110. In these embodiments, the controller 130 might be a processor, such as a microprocessor or a digital signal processor, or a micro-controller. The only technical requirement in the implementation of the controller 130 is that it possess enough computing power to implement the invention as described herein.

The controller 130 is, in this particular embodiment, programmed with an operator interface 230, a Fault Detection Controller ("FDC") 250 and a report generator 260. The operator interface 230 implements an interface, such as a graphical user interface ("GUI"), through a human may interact with the apparatus 100. The FDC controller 250 implements the FDC system as is known in the art. However, in the context of the invention, the FDC controller 250 includes additional capabilities described further below. The report generator 250 is an application program that creates a report request specifying the data needed for a trace data report and sending it to the fabrication tool 110 over the line 120. A "trace data report" reports certain parameters during the tool's operation so that process engineers can monitor the operation. The particular data needed for any given embodiment will be implementation specific. However, exemplary data may include operating parameters such as temperature and pressure. The report request may also specify a reporting frequency and/or reporting duration, e.g., every 15 seconds for the next 1 hour, so that a report may be repetitively generated throughout an operation. In some variations, the report request might also specify a "trigger," or condition that might, for instance, trigger the formulation of a report.

The operator interface 230, FDC controller 250 and report generator 260 are implemented in software. As such, they each comprise a plurality of instructions encoded on some form of program storage medium that, when executed by the controller 130, perform the tasks described herein. The instructions are, in this embodiment, encoded on the controller 130's hard disk 135. However, any computer-readable, program storage medium might be used. The medium may be either magnetic or optical in nature, and the invention is not limited by this aspect of the implementation. Thus, the instructions might alternatively be encoded on an optical disk 140 or a floppy disk 145. Indeed, the report generator might not even reside on the controller 130 in some embodiments, provided it resides somewhere in the manufacturing framework of which the controller 130 and the fabrication tool 110 are a part.

Note also that the embodiment illustrated in FIGS. 1 and 2 show the all encoded on the same computer, the computer 130, and even the same program storage device, the hard disk 135. However, the invention is not so limited. In alternative embodiments, the FDC controller 250 and the report generator 260 may be distributed across additional computers. One such embodiment is discussed below. In some variations, the FDC controller 250 and/or the report generator 260 might reside on the fabrication tool 110 itself, either on the same storage device as the application program 210, on a second storage device (not shown), or even across two additional storage devices.

Figure 3:
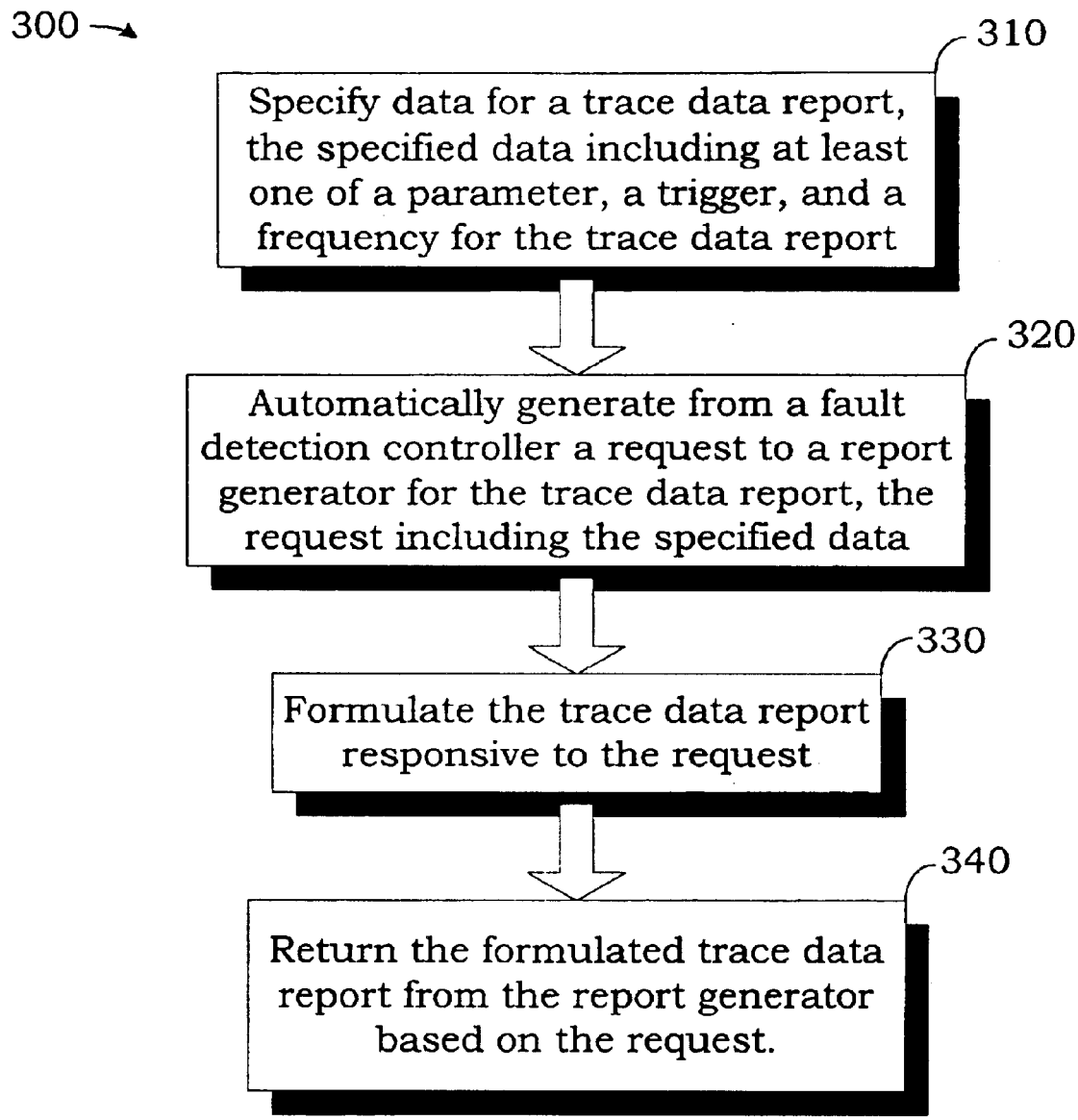
FIG. 3 illustrates one particular embodiment of a method in accordance with one aspect of the present invention.

FIG. 3 illustrates one embodiment of a method 300 practiced in accordance with one another aspect of the invention. The method 300 will be described below in the context of the apparatus 100 in FIGS. 1 and 2, for the sake of clarity and to further an understanding of the invention. However, the invention is not so limited as the method may be practiced with other apparatus, such as the apparatus 400 of FIGS. 4 and 5 discussed further below.

The method 300 in FIG. 3 is but one aspect of the present invention. The present invention also includes the controller 130 programmed to perform the method 300 or even just the program storage medium, such as the disks 135, 140, 145, on which the program is encoded. Still other variations and permutations of these aspects are included with the scope and spirit of the invention as claimed below.

The method 300 begins by specifying data for a trace data report, the specified data including at least one of a parameter, a trigger, and a frequency for the trace data report, as set forth in the box 310. Typically, the data will includes all of a parameter, a trigger, and a frequency, e.g., "report the temperature every 0.5 seconds once the temperature exceeds 1500° C." However, as those in the art having the benefit of this disclosure will appreciate, there may be circumstances where only one of these data types might be desired in a report.

The method 300 then proceeds by automatically generating from a fault detection controller a request to a report generator for the trace data report, the request including the specified data, as set forth in the box 320. "Automatically generating," as used herein, means without direct human intervention. In conventional practice, a human operator not only must specify the data to be included in the trace data report, but must also actually generate and issue the request. Thus, the conventional practice does not permit the operator to have reports generated on the fly, nor does it provide a dynamic acknowledgement of the instruction for a trace data report.

Next, the method 300 formulates the trace data report responsive to the request, as set forth in the box 330. The trace data report may be generated either by the by report generator 260 or the application program 210 of the fabrication tool 110, depending upon the implementation. In some embodiments, the report generator 260 may request the specified data from the application program 210 and, upon receiving the specified data from the fabrication tool 110, will formulate the trace data report. In some other, alternative embodiments, the report generator 210 may simply request a defined trace data report from the application program 210 that contains the specified data. The trace data report will be generated by the fabrication tool 110 in these embodiments. In still other embodiments, the trace data report may be generated by either the application program 210 or the report generator 260 depending upon the application of predetermined criteria.

The method 300 then concludes, in this particular embodiment, by returning the formulated trace data report from the report generator responsive to and in accordance with the request, as set forth in the box 340. Typically, the report will be returned to the operator at the operator interface, but the invention is not so limited. For instance, the report might be logged and stored for later retrieval or, alternatively, printed at a remote location (not shown) for retrieval by another operator than the one who specified the data at the operator interface 230. The trace data report will also typically be returned from the report generator 260 regardless of whether the report generator 260 or the application program 210 generates the trace data report.

Some portions of the detailed descriptions herein are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 4:
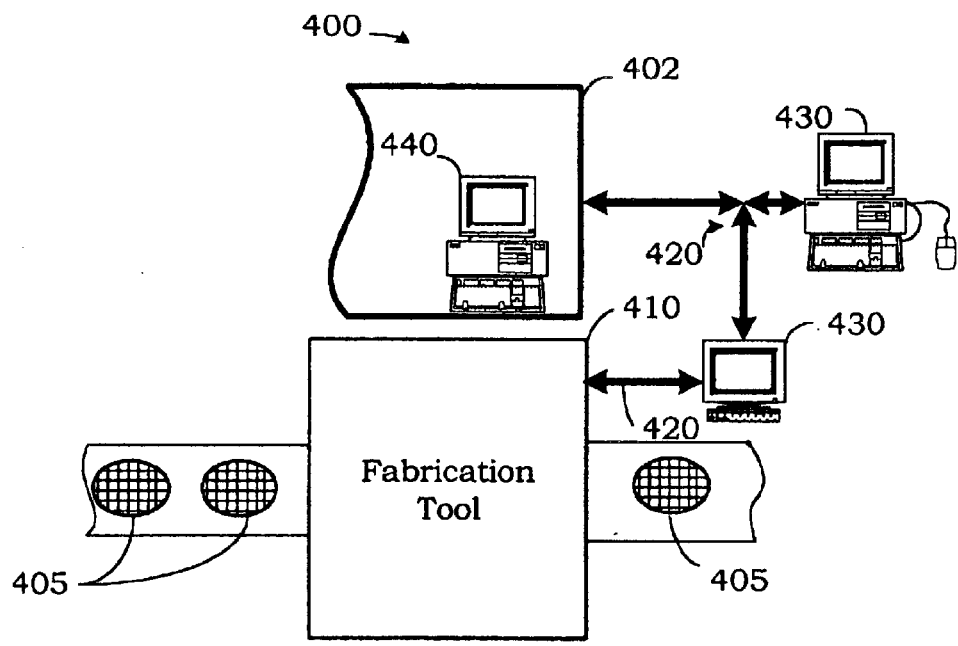
FIGS. 4–6 illustrate one particular embodiment of selected aspects of the invention illustrated in FIGS. 1–3.
Figure 5:
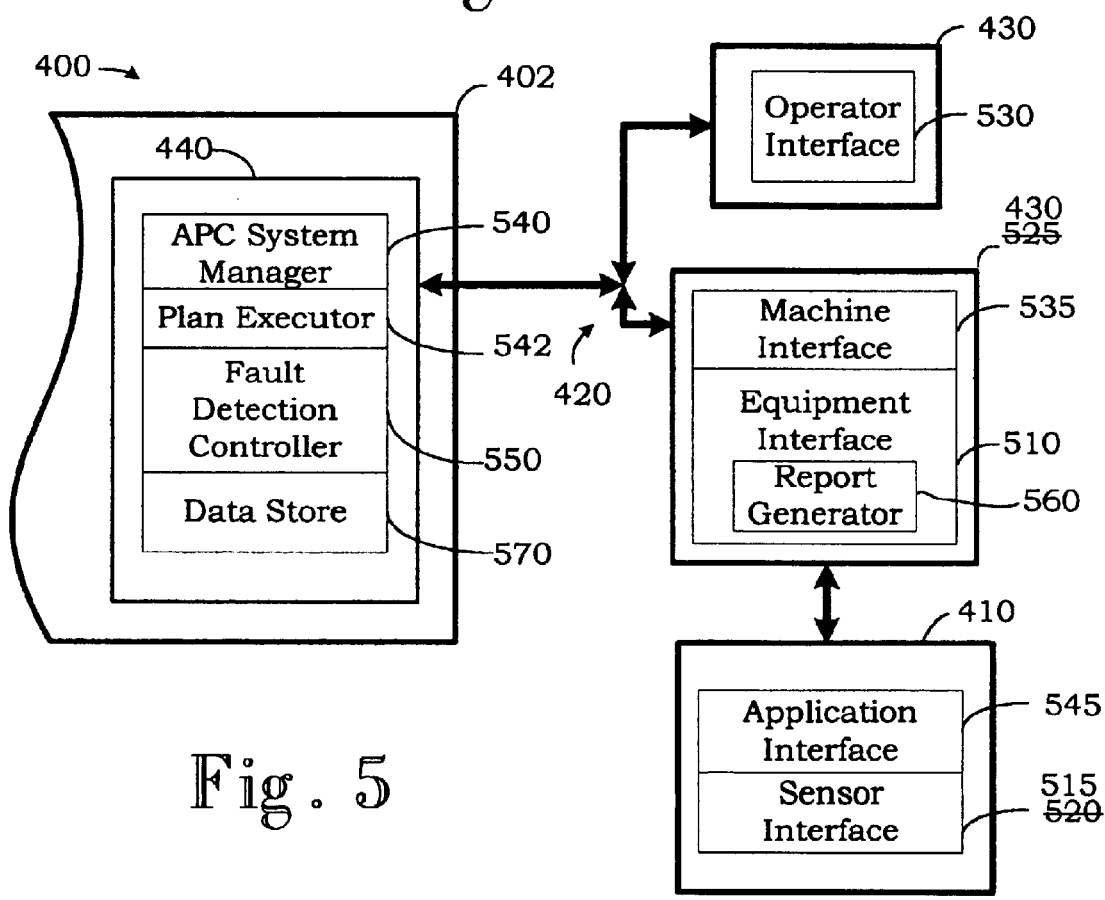
Figure 6:
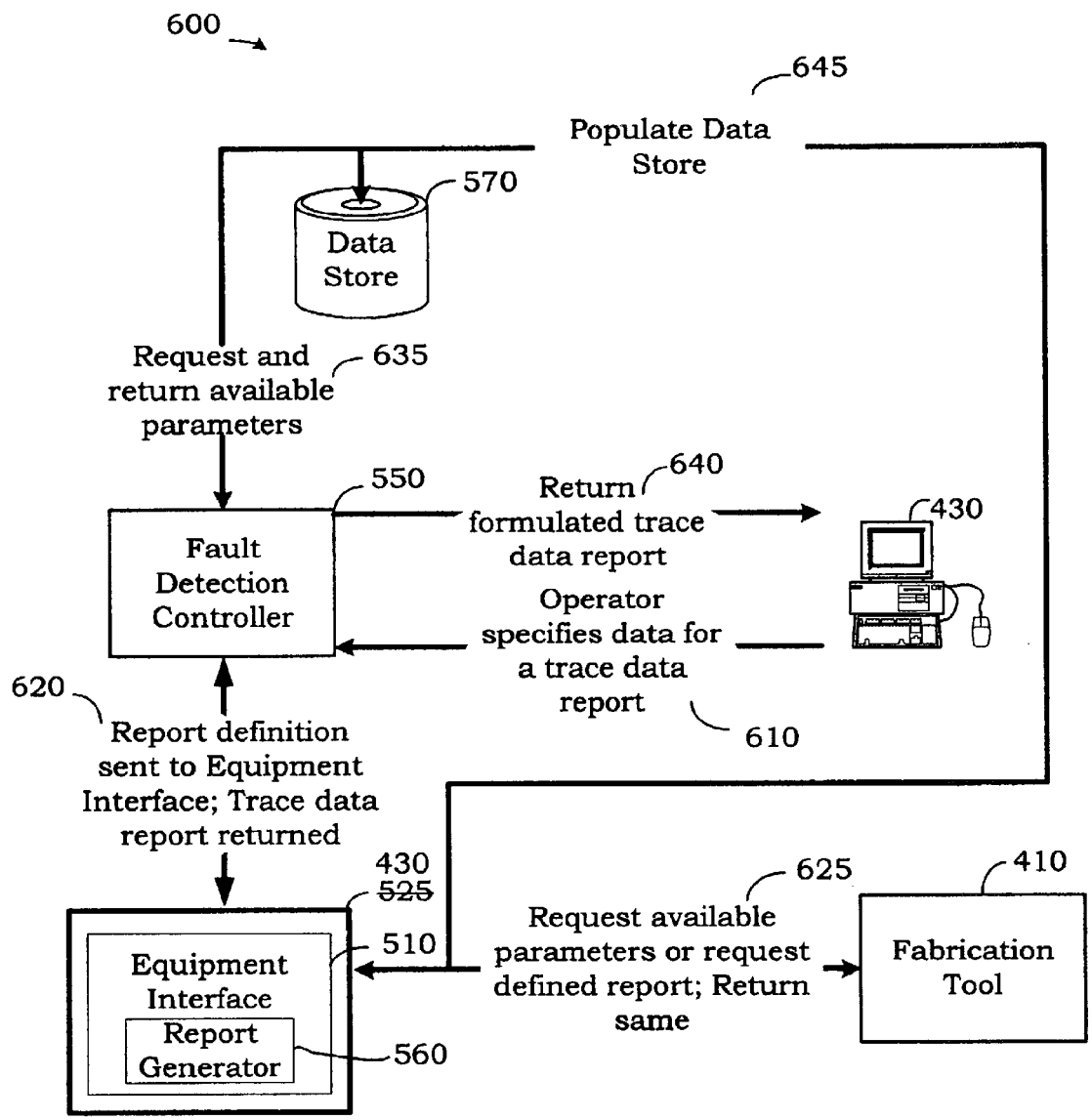

FIGS. 4–6 illustrate one particular embodiment of the invention including the aspects of the invention shown in FIGS. 1–3. The apparatus 400 comprises a portion of an Advanced Process Control Framework ("APCFW") system not otherwise shown. The apparatus 400 implements the method 600 of FIG. 6 in this particular embodiment, although the invention is not so limited. For instance, the apparatus 400 may be used to implement variations on the method 600 and the method 600 may be practiced on an apparatus other than the apparatus 400. Thus, for the sake of clarity, and to further an understanding of the invention, the method 600 shall be disclosed in the context of the apparatus 400 and vice versa.

The APC System comprises a distributed software system of interchangeable, standardized software components permitting run-to-run control and fault detection/classification. The components also implement an architectural standard. More particularly, the APC System is modeled on the architecture of the SEMATECH's Computer-Integrated Manufacturing ("CIM") Framework. Information on this architecture is widely published and available. See, e.g., NIST/SEMATECH Computer-Integrated Manufacturing Framework Public Webpage, downloaded from <http://mel.nist.gov/cimf>. This particular architecture relies heavily on software utilizing object oriented programming and employs the Object Management Group's ("OMG") Common Object Request Broker Architecture ("CORBA") and CORBA Services specifications for distributed object systems. Information and specifications for the OMG CORBA architecture are also readily, publicly available. See, e.g., OMG Webpage, downloaded from <http://www.omg.org/>.

FIGS. 4–5 are conceptualized, structural and functional block diagrams, respectively, of the apparatus 400 within the control of the APC System. A set of processing steps is performed on a lot of wafers 405 by a fabrication tool 410. In this embodiment, the fabrication tool performs heat treatment operations, particularly rapid thermal processing ("RTP") operations, like annealing after ion implantation, and employs the Semiconductor Equipment Communication Standard ("SECS") to generate General Equipment Model ("GEM") reports. Because the apparatus 400 is part of an APC system, the wafers 405 are processed on a run-to-run basis. Thus, process adjustments are made and held constant for the duration of a run, based on run-level measurements or averages. A "run" may be a lot, a batch of lots, or even an individual wafer 405. Overall operation of the fabrication tool 410 within the APC system is directed by an APC System Manager 540 resident on an APC host computer 440.

Referring now to both FIGS. 4 and 5, the APC System comprises, more particularly, a network of processing modules. These processing modules are sometimes referred to as "integration components." Integration components serve as interfaces to existing factory systems and provide capabilities for running APC Plans. An "APC Plan" is an application program called to perform some specific task, as is discussed more fully below. Each of the integration components, e.g., the APC system manager 540, the equipment interface 510, the sensor interface 515, the machine interface 535, and the application interface 545, are, in this particular embodiment, software-implemented. They are programmed in C++ using object-oriented programming techniques as are known in the art.

The integration components include, but are not necessarily limited to:

- the APC system manager 540 resident on the APC host computer 440;
- a Plan Execution Manager 542 resident of the APC host computer 440;
- an equipment interface 510 resident on a workstation 430, which functions in this embodiment as does the application program 210 in the embodiment of FIGS. 1–2 and includes a report generator 560;
- a sensor interface 515 and an application interface 545 resident on a fabrication tool 410;
- a machine interface 535 and an operator interface 530 resident on the workstation 430; and Note that the distribution of the various software components differs from that in the embodiment of FIGS. 1–2. The distribution might differ in other alternative embodiments, as well. One advantage of the APCFW is its modular structure, which provides portability of software components. Thus, the invention is not limited by which computer individual software components reside.

In the present embodiment, the APC system manager 540 provides:

- administrative, configuration, event, and state services for all servers developed for the APC Framework.
- definition, grouping, installation, and management of the components in the APC system.
- centralized services for capturing activity and trace information, for diagnostic and monitoring purposes.
- a centralized repository (data store 570, in this case) of component configuration information, including setup values, system environment settings, and lists of dependent objects and event channels.

However, in alternative embodiments, these functions may be divided into one or more software components, e.g., a base manager, a system manager, a logger, and a registry.

In this particular embodiment, the APC System also includes a Plan Execution Manager 542 ("PEM") not shown), which is the component primarily responsible for "choreographing" the operation of the APC System 402. This involves interpreting APCFW Plans, executing main scripts and subscripts, and invoking event scripts as events dictate. A variety of plans, scripts, and subscripts may be used in various implementations. For instance, the present embodiment includes, but is not limited to, the following plans:

- data collection plan—a data structure used exclusively by a sensor interface and machine interface defined by the PEM, the requirements in which what data should be collected from a specific processing equipment, and how that data should be reported back to PEM;
- duration plan—defines the trigger conditions and the delays when triggers (i.e., conditions that causes add-on sensors to act upon, e.g., start data collection, stop data collection) happen;
- reporting plan—defines what to do with the collected data, as well as when to signal the data's availability; and
- sampling plan—defines the frequency at which the data is to be collected by the external sensor;

However, the number and function of various plans, scripts, and subscripts will be implementation specific.

The PEM coordinates the execution of user-defined process control plans among all the integration components for a given fabrication tool, such as the tool 410. When instructed, the PEM retrieves a plan and its associated scripts. It preprocesses subscripts to provide routines to main and event scripts. It also obtains a list of the capabilities necessary to execute the plan, as specified in the plan and connects to the proper integration components providing the required capabilities.

The PEM 542 then delegates responsibility to run the plan to a Plan Executor ("PE") (not shown). The PE sequentially executes the plan and reports completion of the plan or errors in the execution of the plan to the PEM 542. Thus, while the PEM 542 is responsible for the overall management of all plans executed, a PE 542 is responsible for running only one plan. The PE is created by the PEM 542, exists for the life of the plan, and is destroyed by the PEM 542 after reporting that the plan is completed or aborted. Each PE executes a main script and zero or more event scripts. A PEM 542 can start multiple plans concurrently via multiple Plan Executors.

The machine interface 535 bridges the gap between the APC framework, e.g., the APC system manager 540, and the equipment interface 510. Thus, the machine interface 535 interfaces the fabrication tool 410 with the APC framework and supports machine setup, activation, monitoring, and data collection. In this particular embodiment, the machine interface 535 primarily translates between specific communications of the equipment interface 510 and CORBA communications (discussed further below) of the APC framework. More particularly, the machine interface 535 receives commands, status events, and collected data from the equipment interface 510 and forwards as needed to other APC components and event channels. In turn, responses from APC components are received by the machine interface 535 and routed to the equipment interface 510. The machine interface 535 also reformats and restructures messages and data as necessary. The machine interface 535 supports the startup/shutdown procedures within the APC System Manager 540. It also serves as an APC data collector, buffering data collected by the equipment interface 510, and emitting appropriate data collection events.

The sensor interface 515 and the application interface 545 collect data generated by the sensors (not shown) monitoring the operation of the fabrication tool 410. The sensor interface 515 provides the appropriate interface environment to communicate with external sensors such as LabVIEW® or other sensor, bus-based data acquisition software. The application interface 545 provides the appropriate interface environment to execute control plug-in applications such as LabVIEW, Mathematica, ModelWare, MatLab, Simca 4000, and Excel. More particularly, the sensors may be supplied with the fabrication tool 410 by the original equipment manfucturer ("OEM") or they may be "add-on" sensors installed subsequent to acquisition from the OEM. The sensor interface 515 collects data generated by add-on sensors and the application interface 545 collects data generated by OEM sensors. The sensors may generate data on, for instance, the pressure and temperature of the operating conditions. The plug-in applications collect the data from the sensors and transmit it to the application interface 545. The machine interface 535, the application interface 545, and the sensor interface 515 use a common set of functionality to collect data to be used. The equipment interface 510 gathers the respective data collected by the application interface 545 and the sensor interface 515. The equipment interface 510 then transmits the gathered data to the machine interface 535 resident on a workstation 430.

The operator interface 530 facilitates communication between a wafer fabrication technician ("WFT") and the APC system via a graphical user interface ("GUI"). The GUI (not shown) may be a Windows® or Linux—based operating system. However, this is not necessary to the practice of the invention. Indeed, some alternative embodiments might not even employ a GUI and may communicate through a disk operating system ("DOS")-based operating system. The operator interface 530 displays dialogue boxes to provide information, request guidance and collect additional data. Through a CORBA interface, the operator interface 530 component allows WFTs to display a variety of popup dialogs simultaneously on any number of display groups. The operator interface 530 also maintains a group of displays in which a popup could appear. The operator interface 530 may also provide an announcement operation, i.e., a one-way message that displays a simple popup with message and "OK" button.

The cooperating software components manage process control plans/strategies; collect data from process equipment, metrology tools, and add-on sensors; invoke various process control applications/algorithms with this information; and update process models and modify/download recipe parameters as appropriate. The components communicate with each other using the CORBA Interface Definition Language ("IDL") interfaces and rely on a common set of services to support their interaction. A standard set of distributed-object services are defined by the Object Management Group ("OMG"). Among these services are:

- CORBA—the standard-based communications used for all direct component to-component interaction. Standard interfaces can be defined according to an object-oriented, remote invocation communications model. These interfaces and all APC communications are defined using IDL. Components communicate by invoking operations on each others interfaces. Data is passed between components as operation parameters and return values.
- OMG Event Service—supports asynchronous communications between components. Many of the APC objects emit events as they change state. These events are received by interested event subscribers. Examples of event usage within the APC system include, but are not limited to, communication component state (including error state), notification of fault alarms detected by fault detection and classification software, and reporting of machine status and collected data
- OMG Trading Services enables a component to find another component with which to interact. When a component is installed, a description of its services (a services offer) is exported to the Trading Service. Another component can later request a list of service providers that meet certain criteria The Trading Service supplies a list of other components that can provide the requested service. That capability is used upon component startup to allow one component to find other components with which it must interact. It is also used upon Plan Startup when a Plan Execution component needs to find Capability Providers to provide the required capabilities specified in the plan.

These services are well known in the art. OMG's CORBA/IIOP Specifications document and CORBA Services Specifications documents are widely distributed among those in the art and provide greater detail.

In summary, in the particular embodiment illustrated, the APC system is a factory-wide software system, but this is not necessary to the practice of the invention. The control strategies taught by the present invention can be applied to virtually any semiconductor fabrication tool on a factory floor. Indeed, the present invention may be simultaneously employed on multiple fabrication tools in the same factory or in the same fabrication process. The APC framework permits remote access and monitoring of the process performance. Furthermore, by utilizing the APC framework, data storage can be more convenient, more flexible, and less expensive than local drives. However, the invention may be employed, in some alternative embodiments, on local drives.

Turning now to FIG. 6, there is illustrated one particular embodiment of the method 300 in FIG. 3 implemented on the apparatus 400 of FIGS. 4–5. The method 600 assumes the fabrication tool 410 has been initialized and is processing the wafers 405.

In this variation, the APC System Manager 540 issues a first directive to set up a data collection routine (not shown) resident on the fabrication tool 410. The directive includes collection parameters and reporting parameters, the reporting para meters being retained by the data collection routine in the sensor interface 515. The APC System Manager 540 issues a second directive, containing the data collection parameters, to a Dynamically Linked Library ("DLL"). The data collection routine periodically queries the DLL to determine the presence of the second directive and to retrieve the data collection parameters. Upon detecting the second directive, the data collection routine configures itself in accordance with the data collection parameters in the first and second directives. The data is then collected by the fabrication tool 410 and passed to the DLL for communication to the sensor interface 515. The data is then reported from the sensor interface 515 to the APC System Manager 540.

The apparatus 400 employs a fault detection and classification ("FDC") process control strategy, as does the apparatus 100 in FIGS. 1–2. However, the FDC process control strategy in an APC process uses processing and material parameters to detect and report process problems. The FDC process control strategy can follow traditional statistical process control ("SPC") approaches or it can use more sophisticated techniques, such as principal component analysis ("PCA"). SPC approaches identify adverse data trends in a single parameter whereas PCA identifies faults based on correlated parameters. Both SPC and PCA are well known to those in the art Both batch and real-time fault detection can be performed.

In FDC control, process factors that cause known process shifts (sputter target decay, polish pad wear, and so on) are incorporated into an idealized mathematical model and accommodated through dynamically adjusted processing parameters. Process measurements can be fed forward to downstream APC models, so that adjustments in following processes can be made to compensate for off-target material. In a typical usage scenario, data is collected from the tool 410 and analyzed using an idealized mathematical process model. The results of this analysis can be used to detect when an equipment fault has occurred or is likely to occur. Coupled with a fault classification process or scheme, an FDC process control strategy can detect faults and indicate likely causes of the fault to aid in quick resolution.

The FDC analysis of the APC system consequently possesses several advantages over traditional SPC systems. Even FDC analyses employing SPC approaches possess these advantages. SPC usually detects only two types of process problems. An abrupt change in process behavior or incoming material will be flagged when one or two SPC data points fall near or outside the SPC control limits. A shift in a process will be detected by SPC rules that look for four out of five points more than one sigma away from the process mean, or eight consecutive points all on one side of the process mean. SPC systems typically provide for corrective actions to be defined for each of their rules. Abrupt changes will elicit an indication that there is a problem, prompting for manual identification and resolution.

An APC system employing FDC, on the other hand, permits the process engineer to incorporate these corrective actions into an immediate feedback or feed-forward response. Process factors which cause known process shifts (sputter target decay, polish pad wear, and so on) can be incorporated into APC models and accommodated through dynamically adjusted processing parameters. Process measurements can be fed forward to downstream APC models, so that adjustments in following processes can be made to compensate for off-target material. APC is not designed to replace SPC. Instead, it frees up SPC to focus on the truly exceptional events and unassignable process shifts, while APC corrects for assignable behavior defined in its process model. SPC in turn can help identify when process or material behavior is starting to fall outside of the range controlled by the APC model.

Returning to FIG. 6, the operator specifies data for a trace data report, 610, via the operator interface 530 (shown in FIG. 5) on the workstation 430. The operator can obtain a list of available parameters from the data store 570 via the fault detection controller 550 in this particular embodiment, 635. The data store 570 is populated, 645, with the available parameters by the equipment interface 510. The population may occur upon execution of a Data collection plan as described below.

The specified data is transmitted to the fault detection controller 550. The fault detection controller 550 automatically generates a request to the report generator 560 by transmitting a report definition incorporating the specified data, 620. The term "request" is used in this context, both in the vernacular sense, as in the method 300, and as the term of art whose meaning is imparted by the SECS/GEM implementation of this particular embodiment. The report generator 560 then requests the available parameters and/or a defined report, 625, from the fabrication tool 410.

For data collection, the Plan Executor ("PE") 542 sends a Data Collection Plan ("DCPlan") to the sensor interface 515 or the application interface 545 before data collection. The sensor interface 515 and the application interface 545 parse the information in the DCPlan and forward the specified data to the respective sensors (not shown). The specified data may include duration plan, sampling plan, observables, triggers, and limits (i.e., the set-point or value defining the trigger). At this point, the available parameters become known, and the equipment interface 510 may populate the data store 570 accordingly. In addition, the sensor interface 515 and application interface 545 are also responsible for forwarding the specified data to be acquired from the process equipment, in a predefined format and in predetermined time interval back to the PE 542. The requirements are all specified in the DCPlan. For instance, the PE 542 may wish to have temperature data from the fabrication tool 410. The PE 542 will issue a directive to the sensor interface 515 to configure itself to collect that data at the rate specified by the PE 542, and the PE 542 will instruct the sensor interface 515 to report the data back to the PE 542 at a specified reporting rate.

Depending upon the implementation, the fabrication tool 410 then returns either the parameters or the formulated trace data report, 625, to the report generator 560. The report generator 560 then returns the formulated trace data report to the operator, 610, at the workstation 430 via the fault detection controller 550.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for dynamically generating trace data reports in a semiconductor fabrication process employing fault detection control, the method comprising:

receiving specified data for a trace data report, the specified data including at least one of a parameter, a trigger, and a frequency for the trace data report;

automatically generating from a fault detection controller a request to a report generator for the trace data report, the request including the specified data;

formulating the trace data report responsive to the request; and returning the formulated trace data report from the report generator based on the request.

2. The method of claim 1, wherein receiving the specified data for the trace data report includes receiving the specified data by manual input.

3. The method of claim 1, wherein requesting the trace data report includes consulting a data store of available parameters.

4. The method of claim 3, wherein the data store comprises at least one of a database, a list, and a file.

5. The method of claim 3, wherein the report generator populates the data store with the available parameters.

6. The method of claim 1, wherein formulating the trace data report responsive to the request includes gathering specified data from a fabrication tool.

7. A computer programmed to perform a method for generating data reports in an advanced process control, semiconductor fabrication process, the method comprising:

receiving specified data for a trace data report, the specified data including at least one of a parameter, a trigger, and a frequency for the trace data report;

automatically generating from a fault detection controller a request to a report generator for the trace data report, the request including the specified data;

formulating the trace data report responsive to the request; and returning the formulated trace data report from the report generator based on the request.

8. The programmed computer of claim 7, wherein receiving the specified data for the trace data report in the programmed method includes receiving the specified data by manual input.

9. The programmed computer of claim 7, wherein requesting the trace data report in the programmed method includes consulting a data store of available parameters.

10. The programmed computer of claim 9, wherein the data store comprises at least one of a database, a list, and a file.

11. The programmed computer of claim 9, wherein the report generator populates the data store with the available parameters.

12. The programmed computer of claim 7, wherein the fault detection controller and the report generator reside on a single computer.

13. The programmed computer of claim 7, wherein the fault detection controller and the report generator reside on different computers.

14. The programmed computer of claim 7, wherein formulating the trace data report responsive to the request in the programmed method includes gathering specified data from a fabrication tool.

15. A computer-readable, program storage medium encoded with instructions that, when executed by a computer, perform a method for generating data reports in an advanced process control, semiconductor fabrication process, the programmed method comprising:
- receiving specified data for a trace data report, the specified data including at least one of a parameter, a trigger, and a frequency for the trace data report;
- automatically generating from a fault detection controller a request to a report generator for the trace data report, the request including the specified data;
- formulating the trace data report responsive to the request; and
- returning the formulated trace data report from the report generator based on the request.

16. The computer-readable, program storage medium of claim 15, wherein specifying data for a trace data report in the programmed method includes receiving the specified data by manual input.

17. The computer-readable, program storage medium of claim 15, wherein requesting the trace data report in the programmed method includes consulting a data store of available parameters.

18. The computer-readable, program storage medium of claim 17, wherein the data store comprises at least one of a database, a list, and a file.

19. The computer-readable, program storage medium of claim 17, wherein the report generator populates the data store with the available parameters.

20. The computer-readable, program storage medium of claim 15, wherein the fault detection controller and the report generator reside on a single computer.

21. The computer-readable, program storage medium of claim 15, wherein the fault detection controller and the report generator reside on different computers.

22. The computer-readable, program storage medium of claim 15, wherein formulating the trace data report responsive to the request in the programmed method includes gathering specified data from a fabrication tool.

23. A semiconductor fabrication processing system, comprising:
- a fabrication tool capable of providing at least one of specified data and a trace data report;
- a fault detection controller implementing a fault detection control, the fault detection controller being capable of automatically generating a request for the trace data report, the request including the specified data;
- a report generator capable of requesting at least one of the specified data and the trace data report from the fabrication tool and capable of, if the specified data is requested from the fabrication tool, providing the trace data report; and
- an operator interface for receiving specified data for the trace data report, the specified data including at least one of a parameter, a trigger, and a frequency for the trace data report, and to which the trace data report may be returned from at least one of the report generator and the fabrication tool.

24. The semiconductor fabrication processing system of claim 23, wherein the operator interface includes a graphical user interface.

25. The semiconductor fabrication processing system of claim 23, further comprising a data store of available parameters that may be received as the specified data.

26. The semiconductor fabrication processing system of claim 25, wherein the data store comprises at least one of a database, a list, and a file.

27. The semiconductor fabrication processing system of claim 25, wherein the report generator is capable of populating the data store with the available parameters.

28. The semiconductor fabrication processing system of claim 23, wherein at least two of the fault detection controller, the operator interface, and the report generator reside on the same computer.

29. The semiconductor fabrication processing system of claim 23, wherein the fault detection controller and the report generator reside on different computers.

30. An advanced process control, semiconductor fabrication processing system, comprising:
- means for fabricating a wafer, the fabricating means being capable of providing at least one of specified data and a trace data report;
- means for implementing a fault detection control, the fault detection control means being capable of automatically generating a request for the trace data report, the request including the specified data;
- means for generating a report, the report generating means being capable of requesting at least one of the specified data and the trace data report from the fabricating means and capable of, if the specified data is requested from the fabricating means, providing the trace data report; and
- means for interfacing with an operator, through which an operator may specify the data for the trace data report, the specified data including at least one of a parameter, a trigger, and a frequency for the trace data report, and to which the trace data report may be returned from at least one of the report generating means and the fabricating means.

31. The semiconductor fabrication processing system of claim 30, wherein the interfacing means includes a graphical user interface.

32. The semiconductor fabrication processing system of claim 30, further comprising means for storing identities of available parameters that may be specified.

33. The semiconductor fabrication processing system of claim 32, wherein the storing means comprises at least one of a database, a list, and a file.

34. The semiconductor fabrication processing system of claim 32, wherein the report generating means is capable of populating the storing means with the available parameters.

35. The semiconductor fabrication processing system of claim 30, wherein at least two of the fault detection control means, the interfacing means, and the report generating means reside on the same computer.

36. The semiconductor fabrication processing system of claim 30, wherein the fault detection controller and the report generator reside on different computers.

* * * * *